(12) United States Patent
Keefer

(10) Patent No.: US 6,313,765 B1
(45) Date of Patent: *Nov. 6, 2001

(54) METHOD FOR SAMPLE RATE CONVERSION OF DIGITAL DATA

(75) Inventor: Lyndon M. Keefer, Phoenix, AZ (US)

(73) Assignee: L-3 Communications Corporation, Phoenix, AZ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/948,854

(22) Filed: Oct. 10, 1997

(51) Int. Cl.$^7$ .................................................... H03M 7/00
(52) U.S. Cl. ............................................. 341/61; 364/723
(58) Field of Search ......................... 341/50, 61; 364/723

(56) References Cited

U.S. PATENT DOCUMENTS

| | | | |
|---|---|---|---|
| 4,020,332 | * 4/1977 | Crochiere et al. | 341/61 |
| 4,184,049 | 1/1980 | Crochiere et al. | 179/1 |
| 4,320,519 | 3/1982 | Kelley et al. | 375/26 |
| 4,460,890 | 7/1984 | Busby | 340/347 |
| 4,901,077 | 2/1990 | Christopher | 341/143 |
| 5,051,981 | 9/1991 | Kline | 370/32.1 |
| 5,111,417 | 5/1992 | Belloc et al. | 364/724.1 |
| 5,262,970 | 11/1993 | Sevenhans et al. | 364/724.1 |
| 5,319,801 | 6/1994 | Richey et al. | 455/79 |
| 5,387,910 | 2/1995 | Medan et al. | 341/61 |
| 5,475,792 | 12/1995 | Stanford et al. | 395/2.42 |
| 5,512,895 | 4/1996 | Madden et al. | 341/61 |
| 5,559,513 | * 9/1996 | Rothermel et al. | 341/61 |
| 5,612,975 | * 3/1997 | Becker et al. | 375/319 |
| 5,786,778 | * 7/1998 | Adams et al. | 341/61 |
| 5,792,970 | * 8/1998 | Mizobata | 84/607 |

* cited by examiner

Primary Examiner—Peguy JeanPierre
(74) Attorney, Agent, or Firm—Michael A. Lechter; William R. Bachand; Squire, Sanders & Dempsey

(57) ABSTRACT

A method for converting digital data which has been sampled at a first rate to a second rate. Audio data is stored on a compact disk at high frequency and it may be desirable to use this data on a codec which has a lower sampling rate. In the situation where the two sampling rates are not integer factors of one another a method has been developed to compare the ratios of the two sampling rates and using ratio to analyze each sample number of the bitword in the original data set to determine if sampling of that particular bitword is necessary.

7 Claims, 5 Drawing Sheets

METHOD FOR SAMPLE RATE CONVERSION OF DIGITAL DATA

FIELD OF THE INVENTION

The present invention relates to a method for converting a digital signal sampled at a first rate to a digital signal sampled at a second rate.

BACKGROUND OF THE INVENTION

Digital sample rate conversion is used in many types of digital systems. Audio signals, such as might be generated in making recordings of music, are often processed digitally. The various pieces of equipment used to process and record the signals will not always operate at the same sampling frequency. As a result, it often necessary that each piece of equipment accept a digital signal sampled at a first rate and then convert it to a digital signal with second sampling rate before processing it. The information content of the signal must not be appreciably changed by the sample rate conversion or the sound quality of the signal might be degraded.

A very simple way to accomplish sample rate conversion is to simply drop out samples from the first signal. The output wave form thus has fewer samples per second and therefore has a lower sample rate. Assuming the Nyquist criterion is met in the output signal, it is accurate representation of the same signal as the input. This process is call "decimation." It is limited, though to situations in which sampling rate of the input is an integer multiple of the sampling rate of the output.

A process called interpolation may be used when the sampling rate of the output is intended to be an integer multiple higher than the sampling rate of the input signal. In an interpolation operation, an intermediate signal is first produced by filling the time between samples of the input signal with samples which are arbitrarily assigned the value of zero. The intermediate signal is called a "zero stuffed" signal. Because samples are added while the time span is kept the same, the zero stuff signal has a higher sampling rate than the input signal. The higher frequency zero-stuffed signal is filtered in a digital interpolation filter which smoothes out the discontinuities caused by adding the extra samples. The result is a digital signal which has the same shape as the input signal, but contains more samples per second.

The processes of decimation and interpolation may be combined. For example, a circuit could decimate by a factor of M and interpolate by a factor of L. The resulting output would have a sampling rate in a ratio of L/M to the input sampling rate. Such a circuit is limited to scaling the sample rate by a whole number. More importantly, for a digital signal there are practical limits on the ranges of values for M and L. M cannot be so large that the decimated signal no longer satisfies the Nyquist rate. L cannot be made arbitrarily large because the complexity of the interpolation filters increases as L gets larger.

One method of resampling that has been widely used is when the input digital signal is converted back to an analog signal. It is filtered to smooth out discontinuities and then introduced in the digital analog conversion process and then resampled at a second rate to produce an output signal with the desired sampling rate. This type of resampling still has limitations because analog to digital converters are often expensive and multiple conversion operations will likely introduce noise into the signal. This technique also has a disadvantage of distortions due to nonlinearities, intermodulation, imperfect phase response and noise which are inherent in the system.

The type of resampling schemes described above may be used in a coder/decoder which is commonly known as a codec. A codec is used in telecommunications systems. The codec is used to convert a signal, through an analog to digital conversion to digital data and then to reconstitute the signal by performing a digital to analog conversion of the signal data and passing the resulting signal through a receive filter. The analog to digital conversion of the signal is accomplished by taking periodic samples of the signal. The periodic sampling of the signal is governed by the sampling theorem. For a codec, the sampling is done at an eight kilohertz rate which means that at every 125 microseconds a point on the sign wave is sampled.

A codec is often used for converting voice data stored on a compact disc (CD). The voice data on a CD takes advantage of the enormous storage capability of a CD. It generally covers a much bigger range of amplitude than is needed and has embedded error correction in. Resampling is often used to take voice data archived on a CD and convert it for use on a codec which is a very common device for converting digitally sampled voice on phones. The use of a codec in this situation is superior to what is described in the prior art, because past solutions have used high fidelity tapes and analog equipment that requires a lot of memory and were considerably expensive to build.

SUMMARY OF THE INVENTION

Disclosed herein is a method of converting digital data which has been sampled at a first rate to digital information which has a second sampling rate. The method described herein can be used in situations were voice data is stored on a compact disc (CD) at a high (first) sampling rate and then must be converted for use an a codec which has a lower (second) sampling rate. In almost all cases the higher sampling rate is not a whole number multiple of the lower sampling rate.

According to the resampling method described herein, the digital data which was stored at first sampling rate is first retrieved from memory. The second sampling rate is divided by the first sampling rate to get a ratio, R. The digital data is read serially, and each data word is assigned a consecutive number, S. For each dataword read, S is multiplied by R. If the fractional portion of S*R<R/2, datawords S and S−1 are selected and an extrapolation process is performed between the two datawords to determine the value of the resampled dataword.

If S*R>1−R/2, samples S and S+1 are selected and an extrapolation process is performed between the two datawords to determine the value of the resampled dataword. The resampled values can then be read with a translation device such as a codec.

DESCRIPTION OF THE PREFERRED EMBODIMENT

Figure 1:
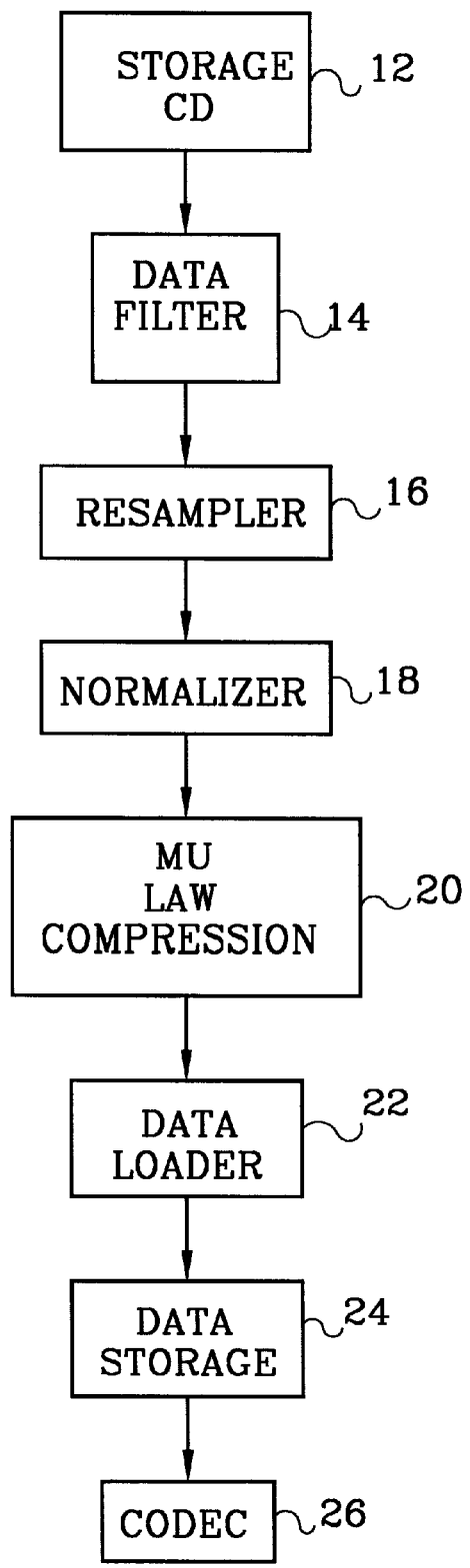
FIG. 1 discloses a system diagram for performing resampling.

Disclosed in FIG. 1 is a system diagram for the resampling system. Initially analog data which has been sampled at a first sampling rate and converted to a digital form is stored in compact disc 12. Compact discs are good storage media, especially for voice information, because this type of media generally covers a much greater range of amplitude and has embedded error correction in it. From the storage compact disc the data is first transmitted to data filter 13. This data filter takes the form of a 45th order maximally flat digital low pass filter which is designed to provide greater than 40 dB of rejection at 4 kHz.

From data filter 13, the filtered digital data is fed into resampler 16. This component performs the resampling of the data which converts the digital data from one sampling frequency to another. In the embodiments of the invention described herein this is done without any conversion to an analog signal. This method will be described in greater detail below.

After the data has been resampled it is transmitted to normalizer 18 for the purpose of adjusting the amplitude of the data to fit within the Mu-Law range and to remove the variations in the recording level of the original data. This assures that important messages used in annunciators will be heard at the same level. To accomplish this the maximum and minimum amplitudes of the entire body of data processed to this point are measured and this range is compared to the range of the Mu-Law compression range to derive a ratio which is used to fit the data into the Mu-Law range. From the normalizer, the data is transmitted to the Mu Law compression apparatus 20 so that the data is properly processed to be used at the different sampling rate. The information is then transmitted to data loader 22 which stores the data in memory 24. At this point the data can be read out of memory and used by codec 26.

A codec is a very common device these days used for converting digitally sampled voice data to analog signals. One application of this technology is in use for voice warning systems in the cockpit of vehicles. High fidelity voice information which is archived on CD (sampled at 44.1 kHz) needs to be resampled so that it may play on a codec which has lower sampling rate (8.0 kHz). The use of a codec to process the voice information is advantageous because it is relatively simple and requires smaller amounts of memory.

Figure 2:
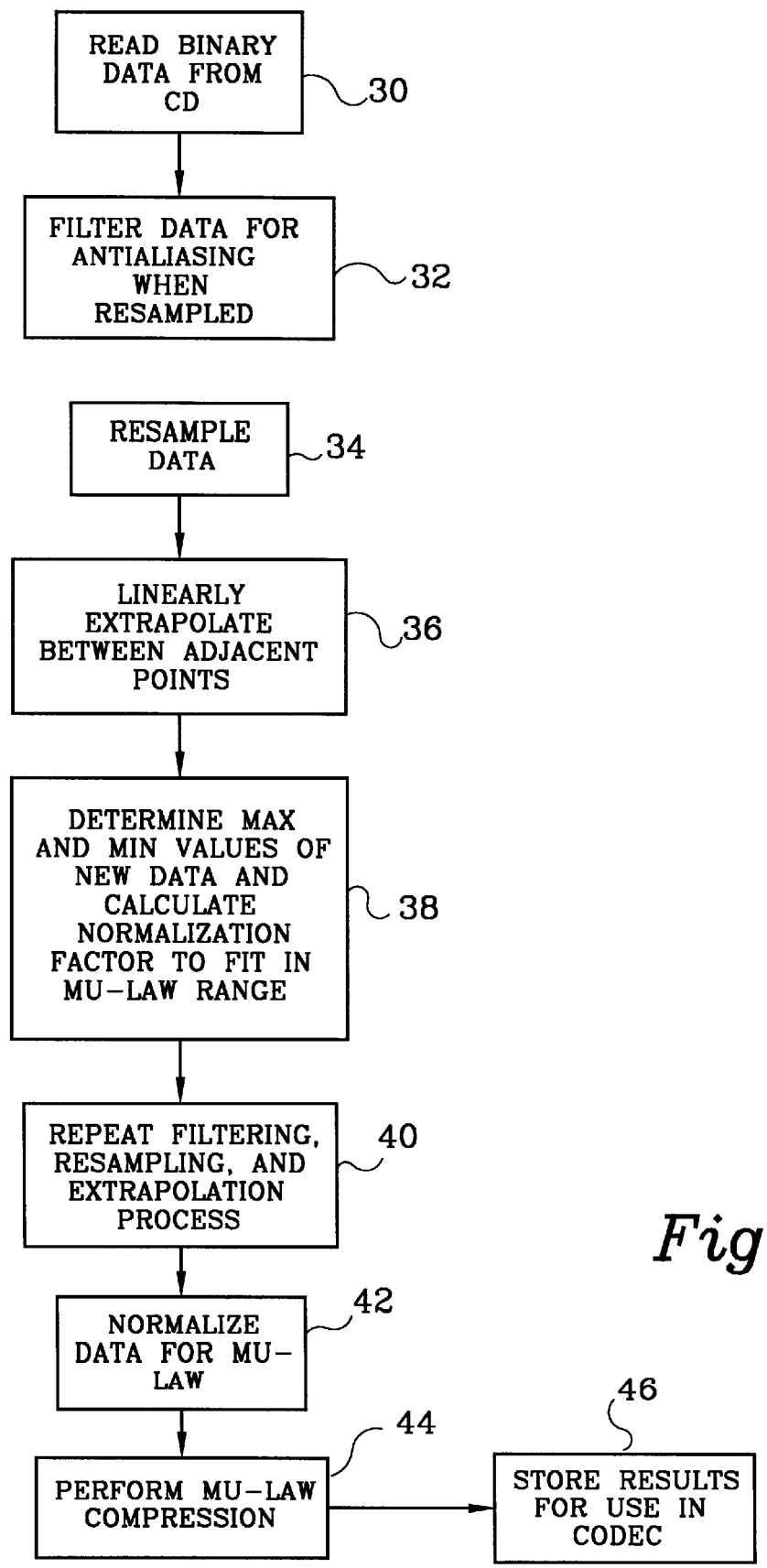
FIG. 2 discloses a flow chart describing the operation of the resampling system.

A flow diagram which describes the over all operation of the sampling system is provided in FIG. 2. The process begins at step 30 when the digital data is initially read from the compact disc. In order to avoid any aliasing effects when the data is sampled at a different sampling rate, the digital data is filtered at step 32. After this at step 34 the data is resampled according to methods which will be described below. The end effect, is that the digital data is resampled at a different frequency.

At this point, because the two sampling rates are not divisible by whole numbers, an extrapolation process must be performed at 36. Because it is likely that the resampled value occurred somewhere between two samples of the original data, which undoubtedly have different magnitudes, a linear extrapolation process must be performed between the two original samples. Once all of the digital data has been resampled and extrapolated the resampled data is analyzed to determine maximum and minimum values at step 38 and a normalization factor is calculated to fit this data in the appropriate MU-law range. Once this normalization factor is calculated at 40, the resampling and extrapolation process are then performed again on the original digital data. Once this process is performed for a second time, the data is compressed into the 8 bit MU-law format at step 44. At step 46 the resampled digital data is stored in memory for use by the codec. The additional processing of the sampled data can be avoided if a second data file is created to store the body of data processed up to this point. The measured maximum and minimum values are adjusted for the amplitude of all the 44.1 kilohertz data by dividing the nearest whole number to make it fit into the MU-law range after all these processes have occurred. If this is not done, the data may be too large and it would clip off sound amplitude or if the data is too small it needs to be multiplied by an appropriate value.

Figure 3:
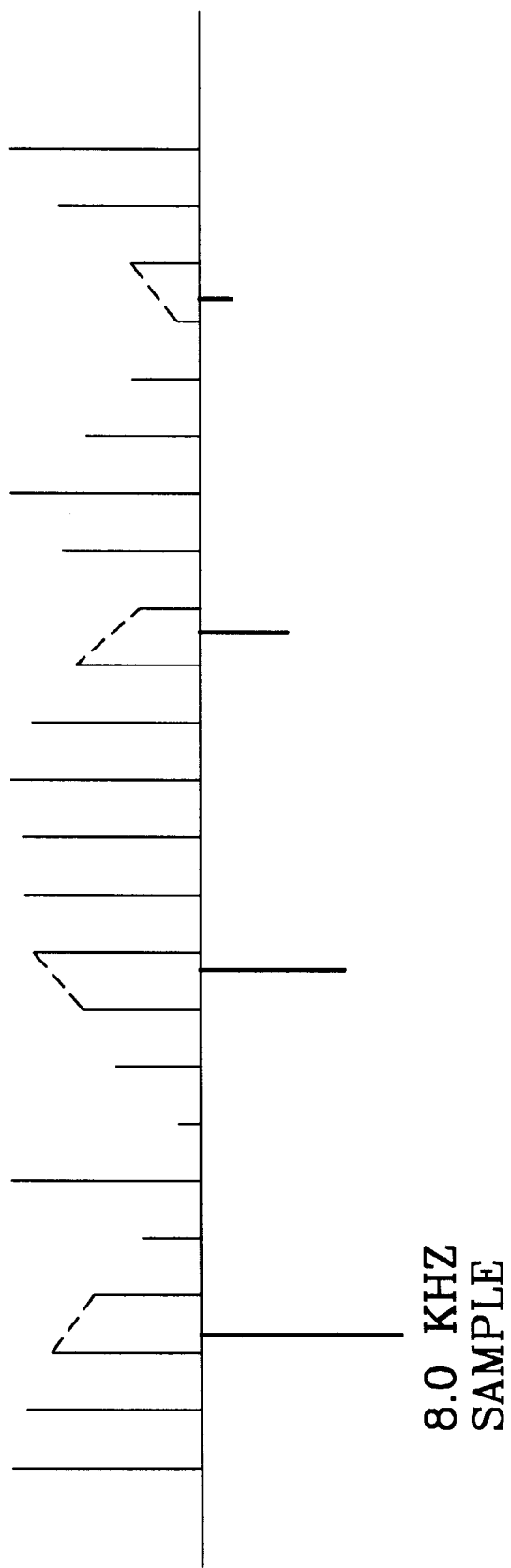
FIG. 3 shows a graph of amplitude versus time and the relative sampling rates of the data.

The process of resampling digital data can be better understood by the graph shown in FIG. 3. The information shown in the graph is for digital data which is stored on a compact disc at 44.1 kHz and is resampled at 8.0 kHz for use by a codec. Along the vertical axis is the amplitude of samples, and along the horizontal axis is time. As can be seen, the 44.1 kHz data samples approximate a sign wave. Below the horizontal axis are the 8.0 kilohertz samples of digital data. Because 44.1 is not a whole numbers and it is not evenly divisible by 8.0 kHz, the 8.0 kilohertz samples will almost always occur between samples of the 44.1 kilohertz digital data. In order to get an accurate sample, an extrapolation process must take into account where between the high frequency digital data samples the low frequency resampling occurs so that a magnitude may be determined.

Figure 4:
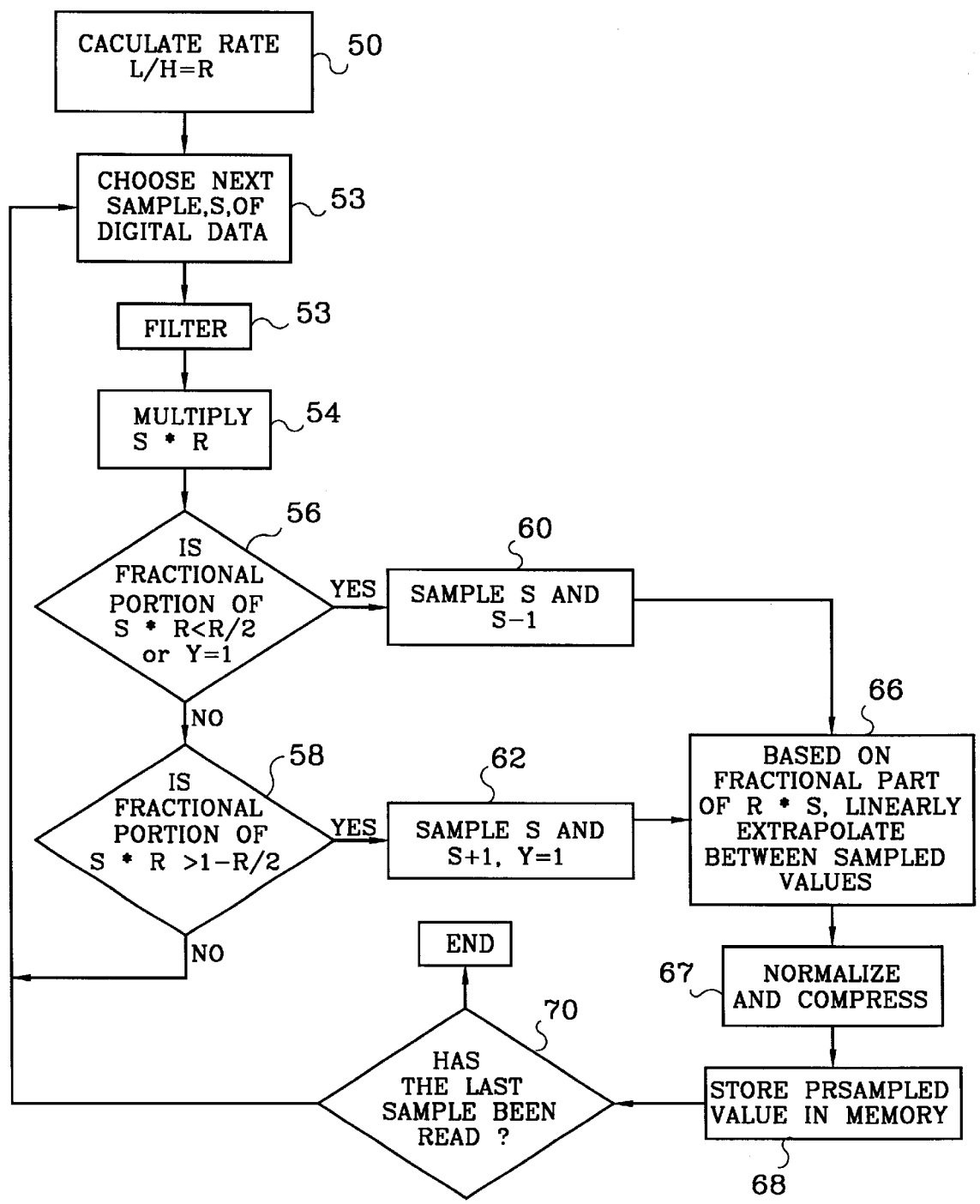
FIG. 4 is a flow chart which describes the resampling method of the first embodiment.

The flow chart in FIG. 4 describes a first embodiment of a method for resampling the digital data. For the purposes of the present description below, the conversion of audio information on a compact disc for use on a codec will be used as an example. This is not meant as a limitation on the invention. The algorithm represented in this flow chart represents a methodical way to resample data that was sampled at a first rate and converted for use at a lower sampling rate. In this case, the two sample rates are not integer factor of one another and it is difficult to resolve how best to sample at a lower rate with a given fidelity. It is also assumed that the desired information has a frequency content of less than half of the new sampling rates so the Nyquist criteria is satisfied.

In the first step 50, a ratio, R, is calculated which is the low frequency resampling rate divided by the high frequency sampling rate. Once this ratio is determined, the next step is to begin analyzing each sample, S, of the high frequency digital data. After a sample is chosen at step 52 and filtered at step 53, it is multiplied by the ratio, R, at step 54. At step 56 a query is made as to whether the fractional value of the sample number, S, multiplied by the ratio is less than the ratio divided by 2. If it is not, a second query is made at step 58 as to whether the fractional value of the sample number S multiplied by the ratio is greater than 1 minus the ratio, R, divided 2. If the answer to this is no, the next sample in the high frequency digital data is chosen at step 52. If at step 56, it is shown that the fractional value of the sample number multiplied by R is less than the R divided by 2, the value of the sample S as well as the value of the previous sample, S−1, are selected at step 60, and a linear extrapolation process is performed on the two samples to determine the an accurate resampled value at step 66. Once the extrapolation process is complete the data is then normalized and compressed at step 67 and the resampled value is stored in memory at step 68. At step 70 a query is made as to whether the last data sample has been analyzed. If it has, the process ends. If it has not, the process returns to the beginning at step 52 and the next high frequency digital sample in sequence is analyzed.

If at step 58 it is determined that the fractional value of the current sample number, S, multiplied by the ratio is greater than 1−R/2, the current sample as well as the next sample are chosen at step 62. At step 66, the linear extrapolation is performed between the values of S and S+1 to determine an accurate resampled value. This resampled value is normalized and compressed at step 67 and stored in memory at step 68.

The advantage of the resampling method described above is that there is a minimum modification to the original data inasmuch as there is no extra analog to digital conversions nor is data artificially modified by stuffing or deleting values. In this sense there is the least amount of error introduced in the resampling process to make data compatible from one medium to the other.

Figure 5:
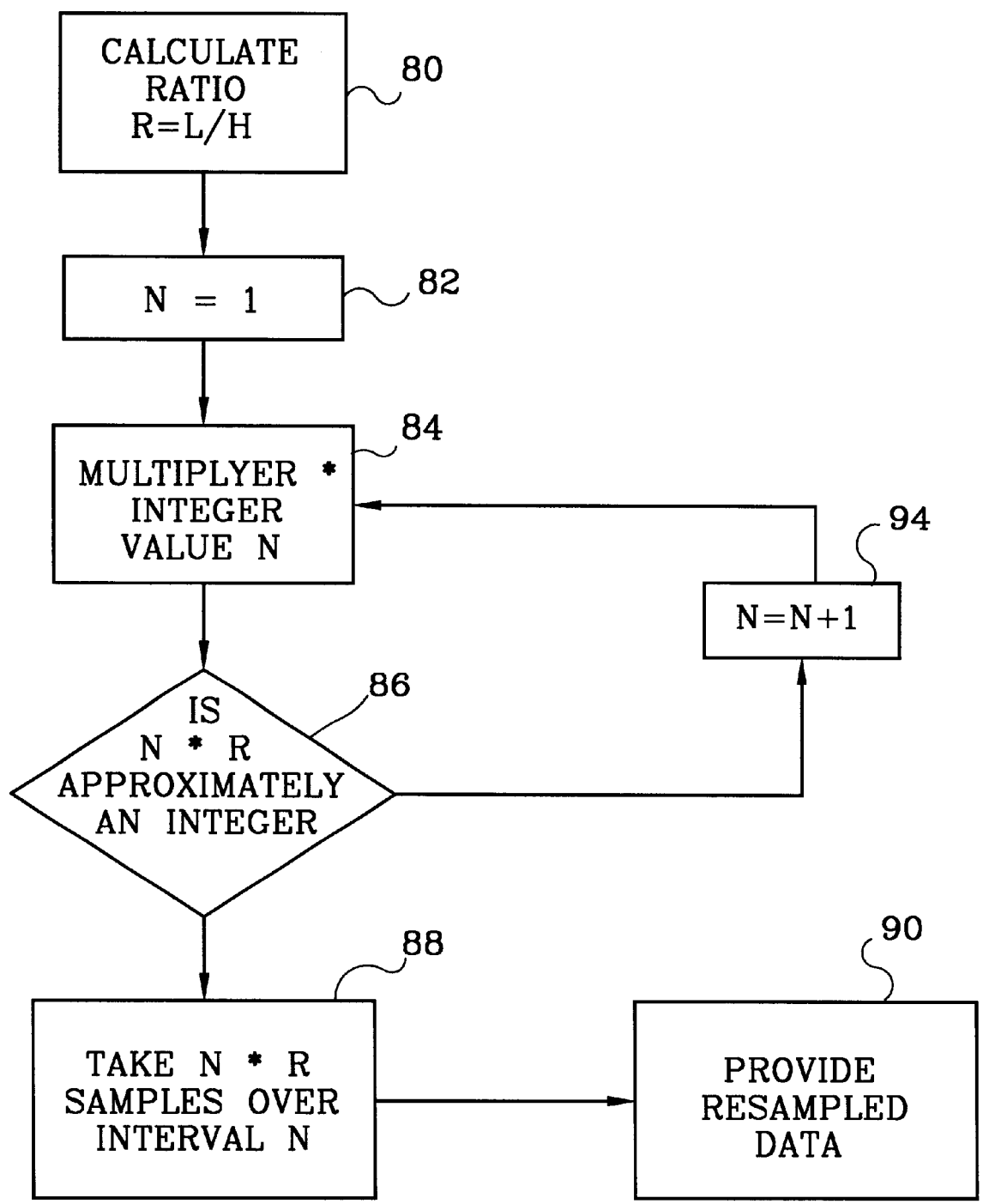
FIG. 5 is a flowchart which describes the resampling method of the second embodiment.

A second embodiment of the invention which provides a less accurate resampling is described in FIG. 5. At step 60 the ratio R is again found which is the ratio of the lower frequency sampling rate over the higher frequency sampling rate. The first key step in this method is to find an integer in which the ratio can be multiplied by in order that this product itself approximates a whole number. At step 82, N is set equal to 1. At step 84, the ratio is multiplied by the integer and at step 86 the product is evaluated. If at this point the product of the two numbers is not sufficiently close to a whole number, N is incremented one at step 94 and the process begins again. If however, the product sufficiently approximates a whole number at step 88, then the nearest whole number to the product N (is) multiplied by R determines a range over which samples may be taken. At step 90, the samples are taken using the linear extrapolation process described above and these samples are provided.

In order to better understand this process, an example may be in order. As was described above assume that a 44.1 kHz data signal is to be resampled at 8.133 kilohertz rates the ratio R would equal 8.133/44.100=0.1844. This ratio is then multiplied by increasing integer values of N until the product equals an integer value itself. At the point N equal 38, 7.008 will be the product and 7 as the number of selections of interval over 38 samples. The approximate sampling rate would then be 44.1*7/38 which equals 8.123 kilohertz. Assume this is not close enough to 8.133 kilohertz to make you feel comfortable with the sound you will get, you can continue on until N equals 103 where you get a product of 103*0.1844=18.9954, which is close to nineteen selections over an interval of 103 original samples. Now the virtual resampling rate is 44.1 times 19/103 which is equal to 8.135 kilohertz which gives you more confidence in the fidelity of the results. Once the resampling process is completed, this interval of sampling is repeated over the body of original data and the further digital data processing described above is performed. Such a discreet interval approximation might lend itself more useful as an algorithm to be incorporated into a digital device.

I claim:

1. A method of converting digital data from a first sampling rate to a second sampling rate comprising the steps of:

reading the digital data stored at the first sampling rate from memory;

dividing the second sampling rate by the first sampling rate to get a ratio R;

selecting each sample of the digital data and multiplying each of the samples of the digital data, S, by ratio R;

if the fractional portion of S*R<R/2, selecting the sample S and sample S−1 and extrapolating between them based on the relative magnitudes the samples S and S−1;

if the fractional portion of S*R>1−R/2, selecting the sample S and sample S+1 and extrapolating between them based on their relative magnitudes.

2. The method of converting digital data from a first sampling rate to a second sampling rate of claim 1 wherein the second sampling rate is less than the first sampling rate.

3. The method of converting digital data from a first sampling rate to a second sampling rate of claim 1 wherein the digital data is converted for use in a codec.

4. The method of converting digital data from a first sampling rate to a second sampling rate of claim 3 wherein the digital data is voice information stored on a compact disc.

5. The method of converting digital data from a first sampling rate to a second sampling rate of claim 4 wherein the digital data is used as part of a voice warning system in a vehicle cockpit.

6. A method of converting digital data from a first sampling rate to a second sampling rate comprising:

reading digital data from memory;

filtering the digital data to avoid aliasing effects;

resampling the filtered digital data through a method comprising the steps of:

dividing the second sampling rate by the first sampling rate to get a ratio R;

selecting each sample of the digital data and multiplying each of the samples of the digital data, S, by ratio R;

if the fractional portion of S*R<R/2, selecting the sample S and sample S−1 and extrapolating between them based on the relative magnitudes the samples S and S−1; and if the fractional portion of S*R>1−R/2, selecting the sample S and sample S+1 and extrapolating between them based on their relative magnitudes, analyzing the entire resampled digital data set to find minimum and maximum values to determine a normalization factor repeating the steps of filtering and resampling of the digital data to normalize the digital data;

compressing the converted digital data to Mu-law format; and storing the converted digital data.

7. The method of converting digital data from a first sampling rate to a second sampling rate of claim 6 wherein the steps of resampling comprise the steps of:

reading the digital data stored at the first sampling rate from memory;

dividing the second sampling rate by the first sampling rate to get a ratio, R;

multiplying the ratio R by ever increasing integer I until their product is equal to approximately a whole number;

multiplying the ratio R by the integer I to identify integer N, which is the number of samples taken over the range of integer I; and sampling the digital data such that N samples are taken over a range of I total samples.

* * * * *